United States Patent
Tian et al.

(10) Patent No.: US 7,427,366 B2
(45) Date of Patent: Sep. 23, 2008

(54) EFFICIENT, GREEN-EMITTING PHOSPHORS, AND COMBINATIONS WITH RED-EMITTING PHOSPHORS

(75) Inventors: Yongchi Tian, Princeton Jct., NJ (US); Perry Niel Yocom, Washington Crossing, PA (US); Gerard Frederickson, Yardley, PA (US); Liyou Yang, Plainsboro, NJ (US)

(73) Assignee: Sarnoff Corporation, Princeton, NJ (US)

( * ) Notice: Subject to any disclaimer, the term of this patent is extended or adjusted under 35 U.S.C. 154(b) by 400 days.

(21) Appl. No.: 11/174,856

(22) Filed: Jul. 5, 2005

(65) Prior Publication Data

US 2006/0012287 A1    Jan. 19, 2006

Related U.S. Application Data

(60) Provisional application No. 60/606,981, filed on Sep. 3, 2004, provisional application No. 60/585,664, filed on Jul. 6, 2004.

(51) Int. Cl.
*C09K 11/56* (2006.01)
*C09K 11/55* (2006.01)
*C09K 11/62* (2006.01)

(52) U.S. Cl. .............. 252/301.4 S; 313/503; 257/98

(58) Field of Classification Search ........... 252/301.4 S; 313/530, 503; 257/98
See application file for complete search history.

(56) References Cited

U.S. PATENT DOCUMENTS

| | | | |
|---|---|---|---|
| 3,790,490 A | 2/1974 | Datta et al. | |
| 4,710,033 A | 12/1987 | Hirano et al. | |
| 5,958,591 A | 9/1999 | Budd | |
| 5,959,316 A | 9/1999 | Lowery | |
| 5,998,925 A | 12/1999 | Shimizu et al. | |
| 6,066,861 A | 5/2000 | Hohn et al. | |
| 6,069,440 A | 5/2000 | Shimizu et al. | |
| 6,084,250 A | 7/2000 | Justel et al. | |
| 6,155,699 A | 12/2000 | Miller et al. | |
| 6,212,213 B1 | 4/2001 | Weber et al. | |
| 6,234,648 B1 | 5/2001 | Borner et al. | |
| 6,245,259 B1 | 6/2001 | Hohn et al. | |
| 6,252,254 B1 | 6/2001 | Soules et al. | |
| 6,255,670 B1 | 7/2001 | Srivastava et al. | |
| 6,273,589 B1 | 8/2001 | Weber et al. | |

(Continued)

FOREIGN PATENT DOCUMENTS

GB    864 343    4/1961

(Continued)

OTHER PUBLICATIONS

Akella, A. and D. A. Keszler, "Sr$_2$LiSiO$_4$F; Synthesis, Structure, and Eu$^{2+}$ Luminescence," *Chem. Mater.* 7(7):1299-302 (1995).

(Continued)

*Primary Examiner*—C. Melissa Koslow
(74) *Attorney, Agent, or Firm*—Lowenstein Sandler PC

(57) ABSTRACT

Provided among other things is a phosphor of the formula $$Sr_{1-x3}Ca_{x3}Ga_2S_4:Eu:xGa_2S_3 \quad (I)$$

wherein x is 0 to about 0.2 (or about 0.0001 to about 0.2), wherein x3 is 0.0001 to 1, and wherein a minor part of the europium component is substituted with praseodymium in an efficiency enhancing amount.

12 Claims, 2 Drawing Sheets

U.S. PATENT DOCUMENTS

| | | | |
|---|---|---|---|
| 6,277,301 B1 | 8/2001 | Hohn et al. | |
| 6,278,135 B1 | 8/2001 | Srivastava et al. | |
| 6,294,800 B1 | 9/2001 | Duggal et al. | |
| 6,303,403 B1 | 10/2001 | Sato et al. | |
| 6,351,069 B1 | 2/2002 | Lowery et al. | |
| 6,366,018 B1 | 4/2002 | Garbuzov et al. | |
| 6,373,188 B1 | 4/2002 | Johnson et al. | |
| 6,396,081 B1 | 5/2002 | Tews et al. | |
| 6,417,019 B1 | 7/2002 | Mueller et al. | |
| 6,429,583 B1 | 8/2002 | Levinson et al. | |
| 6,501,100 B1 | 12/2002 | Srivastava et al. | |
| 6,501,102 B2 | 12/2002 | Mueller-Mach et al. | |
| 6,504,179 B1 | 1/2003 | Ellens et al. | |
| 6,513,949 B1 | 2/2003 | Marshall et al. | |
| 6,521,915 B2 | 2/2003 | Odaki et al. | |
| 6,544,438 B2 * | 4/2003 | Yocom et al. | 252/301.4 S |
| 6,577,073 B2 | 6/2003 | Shimizu et al. | |
| 6,586,882 B1 | 7/2003 | Harbers | |
| 6,596,195 B2 | 7/2003 | Srivastava et al. | |
| 6,603,258 B1 | 8/2003 | Mueller-Mach et al. | |
| 6,616,862 B2 | 9/2003 | Srivastava et al. | |
| 6,621,211 B1 | 9/2003 | Srivastava et al. | |
| 6,632,379 B2 | 10/2003 | Mitomo et al. | |
| 6,649,946 B2 | 11/2003 | Bogner et al. | |
| 6,670,748 B2 | 12/2003 | Ellens et al. | |
| 6,682,207 B2 | 1/2004 | Weber et al. | |
| 6,682,663 B2 | 1/2004 | Botty et al. | |
| 6,685,852 B2 | 2/2004 | Setlur et al. | |
| 6,686,691 B1 | 2/2004 | Mueller et al. | |
| 6,692,136 B2 | 2/2004 | Marshall et al. | |
| 6,695,982 B2 | 2/2004 | Ellens et al. | |
| 6,696,703 B2 | 2/2004 | Mueller-Mach et al. | |
| 6,717,353 B1 | 4/2004 | Mueller et al. | |
| 6,734,467 B2 | 5/2004 | Schlereth et al. | |
| 6,773,629 B2 | 8/2004 | Le Mercier et al. | |
| 6,783,700 B2 | 8/2004 | Tian et al. | |
| 6,791,259 B1 | 9/2004 | Stokes et al. | |
| 6,809,347 B2 | 10/2004 | Tosch et al. | |
| 6,809,471 B2 | 10/2004 | Setlur et al. | |
| 6,811,813 B1 | 11/2004 | Tian et al. | |
| 6,850,002 B2 | 2/2005 | Danielson et al. | |
| 6,936,857 B2 | 8/2005 | Doxsee et al. | |
| 6,939,481 B2 | 9/2005 | Srivastava et al. | |
| 6,943,380 B2 | 9/2005 | Ota et al. | |
| 6,982,523 B2 | 1/2006 | Odaki | |
| 7,002,291 B2 | 2/2006 | Ellens et al. | |
| 7,015,510 B2 | 3/2006 | Srivastava et al. | |
| 7,018,565 B2 * | 3/2006 | Tian et al. | 252/301.4 S |
| 7,023,019 B2 | 4/2006 | Maeda et al. | |
| 7,029,602 B2 | 4/2006 | Oshio | |
| 7,064,480 B2 | 6/2006 | Booker et al. | |
| 7,091,653 B2 | 8/2006 | Ouderkirk et al. | |
| 7,091,661 B2 | 8/2006 | Ouderkirk et al. | |
| 7,125,501 B2 | 10/2006 | Tian et al. | |
| 2001/0038426 A1 | 11/2001 | Bechtel et al. | |
| 2003/0146690 A1 | 8/2003 | Ellens et al. | |
| 2003/0222268 A1 | 12/2003 | Yocom et al. | |
| 2003/0227007 A1 | 12/2003 | Ezuhara et al. | |
| 2003/0228412 A1 | 12/2003 | Chen | |
| 2004/0116033 A1 | 6/2004 | Ouderkirk et al. | |
| 2004/0135504 A1 | 7/2004 | Tamaki et al. | |
| 2004/0145288 A1 | 7/2004 | Ouderkirk et al. | |
| 2004/0145289 A1 | 7/2004 | Ouderkirk et al. | |
| 2004/0145312 A1 | 7/2004 | Ouderkirk et al. | |
| 2004/0145895 A1 | 7/2004 | Ouderkirk et al. | |
| 2004/0145913 A1 | 7/2004 | Ouderkirk et al. | |
| 2004/0150991 A1 | 8/2004 | Ouderkirk et al. | |
| 2004/0159900 A1 | 8/2004 | Ouderkirk et al. | |
| 2004/0164307 A1 | 8/2004 | Mueller-Mach et al. | |
| 2004/0206973 A1 | 10/2004 | Tian et al. | |
| 2004/0212291 A1 | 10/2004 | Keuper | |
| 2004/0227465 A1 | 11/2004 | Mankara et al. | |
| 2004/0245532 A1 | 12/2004 | Maeda et al. | |
| 2005/0184638 A1 | 8/2005 | Mueller et al. | |
| 2005/0199897 A1 | 9/2005 | Setlur et al. | |
| 2005/0205845 A1 | 9/2005 | Delsing et al. | |
| 2005/0211992 A1 | 9/2005 | Nomura et al. | |
| 2005/0218780 A1 | 10/2005 | Chen | |
| 2005/0218781 A1 | 10/2005 | Chen | |
| 2005/0224828 A1 | 10/2005 | Oon et al. | |
| 2005/0230689 A1 | 10/2005 | Setlur et al. | |
| 2005/0239227 A1 | 10/2005 | Aanegola et al. | |
| 2006/0012284 A1 | 1/2006 | Kim et al. | |
| 2006/0012287 A1 | 1/2006 | Tian et al. | |
| 2006/0022582 A1 | 2/2006 | Radkov | |
| 2006/0027781 A1 | 2/2006 | Dong et al. | |
| 2006/0027785 A1 | 2/2006 | Wang et al. | |
| 2006/0027786 A1 | 2/2006 | Dong et al. | |
| 2006/0028122 A1 | 2/2006 | Wang et al. | |
| 2006/0033081 A1 | 2/2006 | Hintzen et al. | |
| 2006/0038477 A1 | 2/2006 | Tamaki et al. | |
| 2006/0049414 A1 | 3/2006 | Chandran et al. | |
| 2006/0055315 A1 | 3/2006 | Booker et al. | |
| 2006/0061252 A1 | 3/2006 | Sohn et al. | |
| 2006/0071589 A1 | 4/2006 | Radkov | |
| 2006/0097245 A1 | 5/2006 | Aanegola et al. | |
| 2006/0103291 A1 | 5/2006 | Ellens et al. | |
| 2006/0113553 A1 | 6/2006 | Srivastava et al. | |
| 2006/0145123 A1 | 7/2006 | Li et al. | |
| 2006/0181192 A1 | 8/2006 | Radkov et al. | |

FOREIGN PATENT DOCUMENTS

| | | |
|---|---|---|
| GB | 1087655 | 4/1965 |
| GB | 1414381 | 11/1975 |
| JP | 2001 107036 | 4/2001 |
| KR | 2000 007067 | 2/2000 |
| WO | WO 97/48138 | 12/1997 |
| WO | WO 01/50500 | 7/2001 |
| WO | WO 2005/086239 | 9/2005 |
| WO | WO 2006/001297 | 1/2006 |
| WO | WO 2006/028104 | 3/2006 |

OTHER PUBLICATIONS

Bando, K., et al., "Developing and Application of High Bright White LED Lamp," *Tech Digest*, Phosphor Res. Soc., 264th Meeting, 5-14 (Nov. 29, 1996). [In Japanese with English Summary].

Burrus, H. L. et al., "Fluorescence of $Eu^{2+}$-Activated Alkaline Earth Halosilicates," *J. Luminescence* 3: 467-76 (1971).

Czaya, V. R. and G. Bissert, "Die Kristallstruktur von Tricalcium-monosilikatdichlorid ($Ca_2SiO_4 \cdot CaCl_2$)," *Acta Cryst.* B27:747-53 (1971). [In German with English Abstract].

Garcia, A. et al., "$Ba_5SiO_4Cl_6$:Eu, A New Blue-Emitting Photoluminescent Material with High Quenching Temperature," *J. Electrochem. Soc.: Solid-State Science and Technology* 126(10):1734-36 (Oct. 1979).

Golovastikov, N. I. And V. F. Kazak, "The Crystal Structure of Calcium Chlorosilicate $Ca_2SiO_3Cl_2$," *Sov. Phys. Crystallogr.* 22(5):549-51 (Sep.-Oct. 1977).

Hermoneit, B. et al., "Single Crystal Growth and Some Properties of the New Compound $Ca_3Si_2O_7 \cdot \frac{1}{3}CaCl_2$," *J. Cryst. Growth* 52:660-62 (1981).

Lehmann, Willi, "Heterogeneous Halide-silica Phosphors", *J. Electrochem. Soc.: Solid-State Science and Technology*, p. 748-752, Jun. 1975.

Liu, J. et al., "$Eu^{2+}$-Doped High-Temperature Phase $Ca_3SiO_4Cl_2$: A Yellowish Orange Phosphor for White-Emitting Diodes," *J. Electrochem. Soc.*, 152(11): G880-84 (2005).

Nakamura S., et al., "Superbright Green InGaN Single-Quantum-Well-Structure Light-Emitting Diodes," *Jpn. J. Appl. Phys.* (Letters) 34 (Pt. 2, No. 10B):L1332-35 (Oct. 15, 1995).

Peters, T. E. and J. A. Baglio. "Luminescence and structural properties of thiogallate phosphors $Ce^{+3}$ and $Eu^{+2}$-activated phosphors. Part I." *J. Electrochem. Soc.* 19(2):230-36 (1972).

Peters, T. E. "Luminescent properties of thiogallate phosphors: II. $Ce^3$-activated phosphors for flying spot applications," *J. Electrochem. Soc.* 119(12):1720-23 (1972).

Sun, J. et al., "Study on Luminescence Properties of Eu2+ in (Sr, Ca)$_4$Si$_3$O$_8$Cl$_4$ Host Lattice," *Guang Pu Xue Yu Guang Pu Fen Xi*, 25(11):1760-63 (Nov. 2005). [In Chinese with English Abstract].

Wanmaker, W. L. and J. G. Verriet, "Luminescence of Phosphors with Ca$_3$SiO$_4$Cl$_2$ as the Host Lattice," *Philips Res. Repts.* 28:80-83 (1973).

Winkler, A. et al., "On Chloride Silicates of Calcium, Strontium, and Barium," *Z. Anorg. Allg. Chem.* 504:89-94 (1983). [In German; German & English Abstracts Only].

Winkler, A. et al., "Two New Barium Bromide Silicates and the Molecular Constitution of their Silicate Anions," *Z. .Anorg. Allg. Chem.* 542:131-36 (1986). [In German; German & English Abstracts Only].

Yen, W. M. and M. J. Weber, *Inorganic Phosphors-Composition, Preparation and Optical Properties*, CRC Press: Boca Raton, 2004, pp. 81-85.

Zhang, X. and X. Liu, "Luminescence Properties and Energy Transfer of $Eu^{2+}$ Doped Ca$_8$Mg(SiO$_4$)$_4$Cl$_2$ Phosphors," *J. Electrochem. Soc.* 139(2):622-25 (Feb. 1992).

\* cited by examiner

EFFICIENT, GREEN-EMITTING PHOSPHORS, AND COMBINATIONS WITH RED-EMITTING PHOSPHORS

This application claims the priority of Ser. No. 60/585,664, filed Jul. 6, 2004 and Ser. No. 60/606,981, filed Sep. 3, 2004.

The present invention relates to green-emitting phosphors, to mixtures thereof with red-emitting phosphors, and to white light sources.

Alkaline earth metal thiogallate phosphors activated with divalent europium are generally blue excited, green emitting phosphors. This type of phosphor can be used as an excellent color converter for LED devices such as white light devices.

One such phosphor is of stoichiometric formulation ($SrGa_2S_4$:Eu), and was disclosed in Peters, *Electrochem. Soc.*, vol. 119, 1972, p 230. This phosphor has a low emission efficiency. Recently, a non-stoichiometric thiogallate-based phosphor of formula $SrGa_2S_4$:Eu:x$Ga_2S_3$ was described in U.S. Pat. No. 6,544,438. This phosphor, designated STG, has emission efficiency as high as 90% or higher using a blue light excitation at about 470 nm.

In manufacturing the LED devices with the phosphor powder, typically a thin film of the particulate phosphor needs to be coated on a LED chip so that the phosphor efficiently absorbs the light out of the LED and re-emits light at longer wavelengths. The process of applying the phosphor powder onto LED chips involves delivery of given amount of phosphor powders in fluid form, such as a liquid-based slurry or slurry in molten polymer. To manufacture large volumes of LED lamps, a precise and fast delivery of the phosphor slurry is important. Typically such processes require that the grains of the powder have a narrow range of size, typically a size distribution between 4 and 7 micron, or a smaller, narrow range, such as 5 to 6 microns. The grains in this size range are suitable for ink-jet application.

It has been found that the emission efficiency is dependent on grain size. The larger grains tend to emit more efficiently than the smaller ones. The most efficient STG phosphors typically have median grains sizes between 5 and 9 micron, and the STG grains smaller than 2 micron or 1 micron (median) often do not possess acceptable emission efficiency. It is now found that higher efficiency can be achieved in smaller grains by controlling the size of the particles that comprise the grains. High efficiency STG grains with median grain sizes from 2 to 5 microns can be isolated with the methods of the invention.

In making light emitting devices, the strontium thiogallate phosphors can be mixed with phosphors that emit at a higher wavelength, meaning photonic lower energy. For example, where an LED produces blue light, partial conversion of this blue light by the two phosphors can create white light.

SUMMARY OF THE INVENTION

Provided in one embodiment is a phosphor of the formula $$Sr_{1-x3}Ca_{x3}Ga_2S_4:Eu:xGa_2S_3 \qquad (I)$$

wherein x is 0 to about 0.2 (or about 0.0001 to about 0.2), wherein x3 is 0 to 1, and wherein a minor part of the europium component is substituted with praseodymium in an efficiency enhancing amount.

Provided in one embodiment is a composition of a phosphor of the formula $$Sr_{1-x3}Ca_{x3}Ga_2S_4:Eu:xGa_2S_3 \qquad (I)$$

wherein x is 0 to about 0.2 (or about 0.0001 to about 0.2), wherein x3 is 0 to 1, wherein a minor part of the europium component may be substituted with praseodymium in an efficiency enhancing amount, wherein the median grain size of the phosphor composition is from 2 to 4.5 microns, and wherein the quantum efficiency of the phosphor composition can be 85% or more.

Provided in another embodiment is a method of forming a phosphor of the formula $$Sr_{1-x3}Ca_{x3}Ga_2S_4:Eu:xGa_2S_3 \qquad (I)$$

wherein x is 0 to about 0.2 (or about 0.0001 to about 0.2), wherein x3 is 0 to 1, wherein a minor part of the europium component may be substituted with praseodymium in an efficiency enhancing amount, and wherein the median grain size of the phosphor composition is from 2 to 12 microns, the method comprising:

precipitating $SrSO_4/CaSO_4$, $Pr(OH)_3$ and $Eu(OH)_3$ under conditions selected as appropriate for achieving the desired average grain size in a product of the method (such achievement measured after the settling step(s));

precipitating $Ga(OH)3$ with product of the first precipitating step;

at least once conducting the following two sub-steps:
   grinding the product of the second precipitating step or of a subsequent iteration of this step; and
   firing the ground product in hydrogen sulfide;

at least once suspending the fired product in solvent in which it is not soluble and providing a period of time for a portion of the fired product to settle leaving a second portion suspended; and collecting the phosphor in one or more of the suspended or settled portions.

The first precipitating can be, for example, conducted in an aqueous organic solution having lower polarity than water. Or, the first precipitating can be conducted in an aqueous solution containing a surfactant.

Additionally provided in an embodiment is a light emitting device comprising:
   a light output;
   a light source; and
   a wavelength transformer located between the light source and the light output, comprising $Sr_{1-x3}Ca_{x3}Ga_2S_4$:Eu:$xGa_2S_3$ wherein x is 0 to about 0.2 (or about 0.0001 to about 0.2), wherein x3 is 0 to 1, and wherein a minor part of the europium component is substituted with praseodymium in an efficiency enhancing amount, the wavelength transformer effective to increase the light at the light output having wavelength from 492 nm to 577 nm.

Also provided in an embodiment is a light emitting device comprising:
   a light output;
   a light source; and
   a wavelength transformer located between the light source and the light output, comprising $Sr_{1-x3}Ca_{x3}rGa_2S_4$:Eu:$xGa_2S_3$ wherein x is 0 to about 0.2 (or about 0.0001 to about 0.2), wherein x3 is 0 to 1, wherein a minor part of the europium component may be substituted with praseodymium in an efficiency enhancing amount, wherein the median grain size of the phosphor composition is from 2 to 4.5 microns, and wherein the quantum efficiency of the phosphor composition is 85% or more, the wavelength transformer effective to increase the light at the light output having wavelength from 492 nm to 577 nm.

Further provided is mixture of two or more phosphors, one of a first emission energy and the second of a lower emission energy, comprising: the first phosphor of the formula $$Sr_{1-x3}Ca_{x3}Ga_2S_4:Eu:xGa_2S_3 \qquad (I)$$

wherein x is 0 to about 0.2 (or about 0.0001 to about 0.2), wherein x3 is 0 to 1, and wherein a minor part of the europium component is substituted with praseodymium in an efficiency enhancing amount; and the second phosphor of the formula $$Sr_{x2}Ca_{1-x2}S:Eu^{2+},Y \qquad (II)$$

wherein x2 is a number from 0 to 1 (or about 0.3 to about 0.8), and Y is one or more halides in atomic or ionic form.

Still further provided is a light emitting device with a light output comprising: a light source; a first wavelength transformer located between the light source and the light output, comprising $SrGa_2S_4:Eu:xGa_2S_3$ wherein x is 0 to about 0.2 (or about 0.0001 to about 0.2), wherein x3 is 0 to 1, and wherein a minor part of the europium component is substituted with praseodymium in an efficiency enhancing amount; and a second wavelength transformer located between the light source and the light output, comprising $Sr_{x2}Ca_{1-x2}S:Eu^{2+}$, Y wherein x2 is an number from about 0 to 1 (or about 0.3 to about 0.8), and Y is one or more halides in atomic or ionic form. A third wavelength transformer such as described below, or other wavelength transformers, may be added.

DETAILED DESCRIPTION OF THE INVENTION

Figure 1:
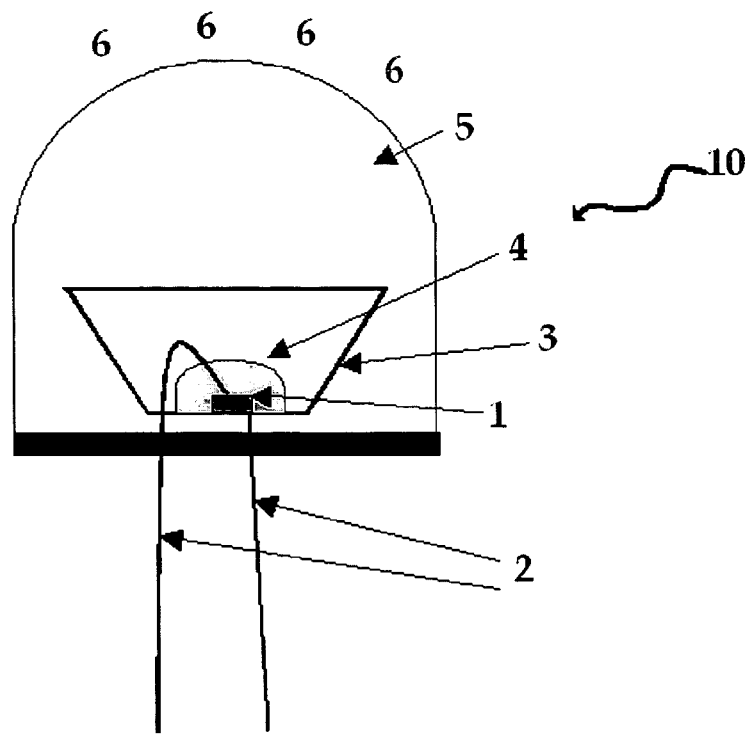
FIGS. 1 and 2 show light emitting devices.

The following terms shall have, for the purposes of this application, the respective meanings set forth below.
grains Grains may be single crystals or agglomerations of single-crystal-like components of a phosphor.
particles Particles are single crystals or the single-crystal-like components of a phosphor.

Green-Emitting Phosphors

The method of the invention comprises a first phosphor-forming process and a second sizing process.

The forming process can comprise, for example, the following steps:
1. Forming a solution (such as in dilute nitric acid) of a soluble strontium or calcium salt (such as the nitrate) and a soluble trivalent europium salt (such as the nitrate). Optionally, a small amount of trivalent praseodymium is added as a soluble salt or mineral (such as $Pr_6O_{11}$).
2. Sufficiently neutralizing the strontium/calcium/europium solution (such as neutralizing with ammonium hydroxide) concurrently with adding a sulfate source (such as sulfuric acid or ammonium sulfate). Concurrently in this context means sufficiently in conjunction to achieve the desired morphology of precipitates. The strontium/calcium is believed to form the sulfate, and together with neutralization, produces the following precipitation (assuming strontium):

$$Sr(NO_3)+Pr(NO_3)_3+Eu(NO_3)_3+NH_4OH+$$
$$H_2SO_4 \rightarrow SrSO_4\downarrow+Pr(OH)_3+Eu(OH)_3\downarrow+NH_4OH.$$

The form of the precipitate is believed to be strontium sulfate particles coated with europium hydroxide. In this precipitation step, the size of the particles within the grains can be adjusted with certain parameters of the precipitation. For example, adding organic solvents to the aqueous medium, such as acetone or ethanol, decreases the polarity of the solvent and leads to a fine powder with smaller particles. Dispersing organic surfactants such as sorbitan monolaurate in the aqueous medium results in very fine particle precipitation. It is believed that smaller particle size allows for high efficiency in smaller grains. Such efficient smaller grain can be achieved with the processes of the invention.
3. Forming a second solution of an acid-soluble gallium salt, such as the nitrate. For example, metallic gallium can be dissolved in nitric acid (e.g., overnight). As gallium oxide is difficult to convert to the sulfide, its use is less favored.
4. A second precipitation is conducted after mixing a suspension of the first Sr/Ca/Eu precipitate with the gallium solution; the gallium solution added to provide an excess x of gallium as in the following formula (assuming strontium:

$$Sr(SO_4):Eu:(2.0+x)Ga(OH)_3.$$

The precipitation is conducted by sufficiently neutralizing (e.g., with ammonia) or adding a chaotrophic agent (such as urea).
5. A fine powder resulting from the second precipitation is dried, ground and fired in hydrogen sulfide. The firing can be in a refractory boat (such as an alumina boat) in a tube furnace. Suitable firing can be, for example, 800 degrees C. for 5 hours. A second grinding and firing under hydrogen sulfide step can be applied to assure uniformity. A suitable second firing can be, for example, 900 degrees C. for 2 hours. X-ray analysis can be used to determine x, as "x" is used in Formula (I).

Water-miscible (including miscible in the aqueous solvent as finally composed for the Sr/Pr/Eu precipitation) solvents for use in the precipitation include, for example, alcohols and ketones.

Neutralizations described herein do not have to be to pH 7, but only sufficiently more neutral (or somewhat basic) to allow the precipitation in question. Temperatures described herein for processes involving a substantial gas phase are of the oven or other reaction vessel in question, not of the reactants per se.

In certain embodiments, the range of x is from one of the following lower endpoints (inclusive) or from one of the following upper endpoints (inclusive). The lower endpoints are 0, 0.0001, 0.001, 0.01, 0.02, 0.03, 0.04, 0.05, 0.06, 0.07, 0.08, 0.09, 0.1, 0.11, 0.12, 0.13, 0.14, 0.15, 0.16, 0.17, 0.18 and 0.19. The upper endpoints are 0.01, 0.02, 0.03, 0.04, 0.05, 0.06, 0.07, 0.08, 0.09, 0.1, 0.11, 0.12, 0.13, 0.14, 0.15, 0.16, 0.17, 0.18, 0.19 and 0.2. For example, the range can be 0.001 to 0.2 or 0.001 to 0.1.

In certain embodiments, the range of x3 is from one of the following lower endpoints (inclusive) or from one of the following upper endpoints (inclusive). The lower endpoints are 0, 0.0001, 0.001, 0.01, 0.02, 0.03, 0.04, 0.05, 0.06, 0.07, 0.08, 0.09, 0.1, 0.2, 0.3, 0.4, 0.5, 0.6, 0.7, 0.8 and 0.9. The upper endpoints are 0.01, 0.02, 0.03, 0.04, 0.05, 0.06, 0.07, 0.08, 0.09, 0.1, 0.2, 0.3, 0.4, 0.5, 0.6, 0.7, 0.8, 0.9 and 1.

When praseodymium is present in the composition, praseodymium substitutes for a minor amount of europium, which amount is effective to enhance the quantum efficiency of the phosphor. The amount is for example 0.001 mol percent to 10 mol percent of europium or 0.05 mol percent to 4 mol percent of europium. In certain embodiments, the range of this percentage is from one of the following lower endpoints (inclusive) or from one of the following upper endpoints (inclusive). The lower endpoints are 0.001, 0.005, 0.01, 0.02, 0.03, 0.05, 0.1, 0.2, 0.3, 0.4, 0.5, 0.6, 0.7, 0.8, 0.9, 1.0, 1.2, 1.4, 1.6, 1.8, 2.0, 3.2, 3.4, 3.6, 3.8, 5, 6, 7, 8 and 9 mol percent. The upper endpoints are 0.005, 0.01, 0.02, 0.03, 0.05, 0.1, 0.2, 0.3, 0.4, 0.5, 0.6, 0.7, 0.8, 0.9, 1.0, 1.2, 1.4, 1.6, 1.8, 2.0, 3.2, 3.4, 3.6, 3.8, 4.0, 5, 6, 7, 8, 9 and 10 mol percent.

In certain embodiments, the range of the median size is from one of the following lower endpoints (inclusive) or from one of the following upper endpoints (inclusive). The lower endpoints are 2.0, 2.5, 3.0, 3.5, 4.0, 4.5, 5.0, 5.5, 6.0, 6.5, 7.0, 7.5, 8.0, 8.5, 9.0, 9.5, 10.0, 10.5, 11.0 and 11.5. The upper endpoints are 2.5, 3.0, 3.5, 4.0, 4.5, 5.0, 5.5, 6.0, 6.5, 7.0, 7.5, 8.0, 8.5, 9.0, 9.5, 10.0, 10.5, 11.0, 11.5 and 12.0.

In certain embodiments, the range of the wavelength of light enhanced by the wavelength transformer is from one of the following lower endpoints (inclusive) or from one of the following upper endpoints (inclusive). The lower endpoints are 492, 493, 494, 495, 496, 497, 498, 499, 500, 501, 502, 503, 504, 505, 506, 507, 508, 509, 510, 511, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 56, 562, 563, 564, 565, 566, 567, 568, 569, 570, 571, 572, 543, 574, 575 and 576 nm. The upper endpoints are 493, 494,495,496, 497,498,499, 501, 502, 503, 504, 505, 506, 507, 508, 509, 510, 511, 512, 513, 514, 515, 516, 517, 518,519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 56, 562, 563, 564, 565, 566, 567, 568, 569, 570, 571, 572, 543, 574, 575,576 and 577 nm.

In certain embodiments, quantum efficiency of the phosphor is 85%, 86%, 87%, 88%, 89% or more.

Red-Emitting Phosphors

The present invention is directed to red strontium-calcium sulfide phosphors having the formula

$$Sr_{x2}Ca_{1-x2}S:Eu^{2+}, Y \qquad (II)$$

wherein x2 is a number of from 0 to 1 (such as about 0.3 to 0.8), and Y is one or more halogens, in either their atomic or ionic forms, and to a method for making them. These phosphors have a high quantum efficiency, up to 95%. They are useful to change or convert light from electroluminescent devices to a different emission at various wavelengths.

The host crystal, $Sr_{x2}Ca_{1-x2}S$, is a solid solution in which the ratio Sr:Ca can be changed arbitrarily. The emission spectrum of the material shifts its peak generally between 605 and 670 nm with changes in the strontium to calcium ratio.

In certain embodiments, the range of the wavelength of light enhanced by the second wavelength transformer is from one of the following lower endpoints (inclusive) or from one of the following upper endpoints (inclusive). The lower endpoints are 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 640, 641, 642, 643, 644, 645, 646, 647, 648, 649, 650, 651, 652, 653, 654, 655, 656, 657, 658, 659, 660, 661, 662, 663, 664, 665, 666, 667, 668, and 669 nm. The upper endpoints are 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669 and 670 nm.

In certain embodiments, the range of x2 is from one of the following lower endpoints (inclusive) or from one of the following upper endpoints (inclusive). The lower endpoints are 0.3, 0.35, 0.4, 0.45, 0.5, 0.55, 0.6, 0.65, 0.7 and 0.75. The upper endpoints are 0.35, 0.4, 0.45, 0.5, 0.55, 0.6, 0.65, 0.7, 0.75 and 0.8.

In certain embodiments, the range of x2 is from one of the following lower endpoints (inclusive) or from one of the following upper endpoints (inclusive). The lower endpoints are 0, 0.0001, 0.0005, 0.001, 0.005, 0.01, 0.02, 0.03, 0.04, 0.05, 0.06, 0.07, 0.08, 0.09, 0.1, 0.2, 0.3, 0.4, 0.5, 0.6, 0.7, 0.8 and 0.9. The upper endpoints are 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 0.95, 0.97, 0.98, 0.99, 0.995, 0.999, 0.9995, 0.9999 and 1.

By combining the present red phosphors with green phosphors and blue LEDs, full color white light can be obtained.

These red phosphors are made by
a) forming a mixture of the sulfate salts of strontium and calcium;
b) adding a solution of europium oxide to the sulfate precipitate;
c) firing the solids to a temperature of about 900° C. in a forming gas atmosphere;
d) firing to a temperature of about 1000° C. in hydrogen sulfide atmosphere to convert the sulfate to the corresponding sulfide;
e) adding an appropriate amount of a halide activator; and
f) firing the mixture of step e) to about 1100° C. in nitrogen atmosphere.

The present phosphors can be efficiently excited by the radiation of a blue light LED or other electroluminescent device to produce a red emission, and can be combined with appropriate phosphors to provide full color white light.

The present calcium-strontium sulfide phosphors can be made by combining the desired amounts of calcium and strontium sulfates.

Calcium sulfate can be made by forming a soluble salt solution, such as of calcium carbonate, precipitating the corresponding sulfate salt with sulfuric acid, decanting the liquid, rinsing the sulfate to remove excess acid, and drying the precipitate.

After drying, the calcium and strontium sulfate salts are combined with europium oxide as the activator, dissolved in nitric acid. The activator is slurried with the insoluble sulfate salts and the slurry is dried at about 100° C. for from 12-24 hours.

The mixture is fired in forming gas at a temperature of about 900° C. and held there for about six hours. The solids are then fired in hydrogen sulfide atmosphere to a temperature of about 1000° C. to form the sulfide salts from the sulfate salts. The desired amount of halide, i.e., fluorine, chlorine, bromine and/or iodine, is added and the temperature increased to about 1100° C. in nitrogen. After cooling the phosphor, it can be ground to a powder.

Other red-emitting phosphors that can be used with the phosphors of the invention include, without limitation: $Y_2O_2S:Eu^{3+},Ce^{3+}$; $Y_2O_2S:Eu^{3+},Sb^{2+}$; $Ca_2MgSi_2O_7:Eu_{2+}, Mn^{2+}$; $Ba_2SiO_4:Ce^{2+},Li^+, Mn^{2+}$; $SrS:Eu^{2+},Cl^-$; $MgBaP_2O_7: Eu^{2+},Mn^{2+}$; $CaS:Eu^{2+}$, $Cl^-$; $ZnGa_2S_4:Mn$; $6MgO.As_2O_5: Mn^{4+}$.

Yellow-Emitting Phosphors

Appropriate phosphors for use as the third wavelength transformer shall be recognized by those of skill in the art. These include those described in U.S. Pat. No. 6,783,700

(which is incorporated by reference herein in its entirety). These further include appropriately selected phosphors of Formula I (with or without substitution with Pr), particularly those described in PCT Appln. WO2004US11927, filed Apr. 15, 2004 (which is incorporated by reference herein in its entirety).

In certain embodiments, the range of the wavelength of light enhanced by the wavelength transformer is from one of the following lower endpoints (inclusive) or from one of the following upper endpoints (inclusive). The lower endpoints are 530 nm and the wavelengths to 609 nm (at, for example, 1 nm increments). The upper endpoints are 611 nm and the wavelengths to 610 nm (at, for example, 1 nm increments). For example, the range can be 530-610 nm or 570-580 nm.

General

When used in a lighting device, it will be recognized that the phosphors can be excited by light from a primary source, such as an semiconductor light source emitting in the wavelength of e.g., 215~515 nm, or from secondary light such as emissions from other phosphor(s) emitting in the same wavelength range. Where the excitation light is secondary, in relation to the phosphors of the invention, the excitation-induced light is the relevant source light. Devices that use the phosphor of the invention can include mirrors, such as dielectric mirrors, to direct light produced by the phosphors to the light output rather than the interior of the device (such as the primary light source).

The semiconductor light source can, in certain embodiments, emit light of 215 nm or more, 300 nm or more, or 305 nm or more, or 310 nm or more, and so on in increments of 5 nm to 515 nm or more. The semiconductor light source can, in certain embodiments, emit light of 515 nm or less, 420 nm or less, or 415 nm or less, or 410 nm or less, and so on in increments of 5 nm to 215 nm or less.

Phosphor particles may be dispersed in the lighting device with a binder or solidifier, dispersant (i.e., light scattering material), filler or the like, The binder can, for example, be a light curable polymer such as an acrylic resin, an epoxy resin, polycarbonate resin, a silicone resin, glass, quartz and the like. The phosphor can be dispersed in the binder by methods known in the art. For example, in some cases the phosphor can be suspended in a solvent, and the polymer suspended, dissolved or partially dissolved in the solvent, the slurry dispersed on the lighting device, and the solvent evaporated. In some cases, the phosphor can be suspended in a liquid, pre-cured precursor to the resin, the slurry dispersed, and the polymer cured. Curing can be, for example, by heat, UV, or a curing agent (such as a free radical initiator) mixed in the precursor. Or, in another example, the binder may be liquefied with heat, a slurry formed, and the slurry dispersed and allowed to solidify in situ. Dispersants include, for example, titanium oxide, aluminum oxide, barium titanate, silicon dioxide, and the like.

It is anticipated that lighting devices of the invention will use semiconductor light sources such as LEDs to either create excitation energy, or excite another system to provide the excitation energy for the phosphors. Devices using the invention can include, for example, white light producing lighting devices, indigo light producing lighting devices, blue light producing lighting devices, green light producing lighting devices, yellow light producing lighting devices, orange light producing lighting devices, pink light producing lighting devices, red light producing lighting devices, or lighting devices with an output chromaticity defined by the line between the chromaticity of a phosphor of the invention and that of one or more second light sources. Headlights or other navigation lights for vehicles can be made with the devices of the invention. The devices can be output indicators for small electronic devices such as cell phones and PDAs. The lighting devices can also be the backlights of the liquid crystal displays for cell phones, PDAs and laptop computers. Given appropriate power supplies, room lighting can be based on devices of the invention. The warmth (i.e., amount of yellow/red chromaticity) of lighting devices can be tuned by selection of the ratio of light from phosphor of the invention to light from a second source.

Suitable semiconductor light sources are any that create light that excites the phosphors, or that excites a phosphor that in turn excites the phosphors of the invention. Such semiconductor light sources can be, for example, Ga—N type semiconductor light sources, In—Al—Ga—N type semiconductor light sources, and the like. In some embodiments, blue or near UV emitting semiconductor light sources are used.

For a semiconductor light source having a using at least two different phosphors, it can be useful to disperse the phosphors separately, and superimpose the phosphor layers instead of dispersing the phosphors together in one matrix. Such layering can be used to obtain. a final light emission color by way of a plurality of color conversion processes. For example, the light emission process is: absorption of the semiconductor light source light emission by a first phosphor, light emission by the first phosphor, absorption of the light emission of the first phosphor by a second phosphor, and the light emission by the second phosphor.

Figure 3:
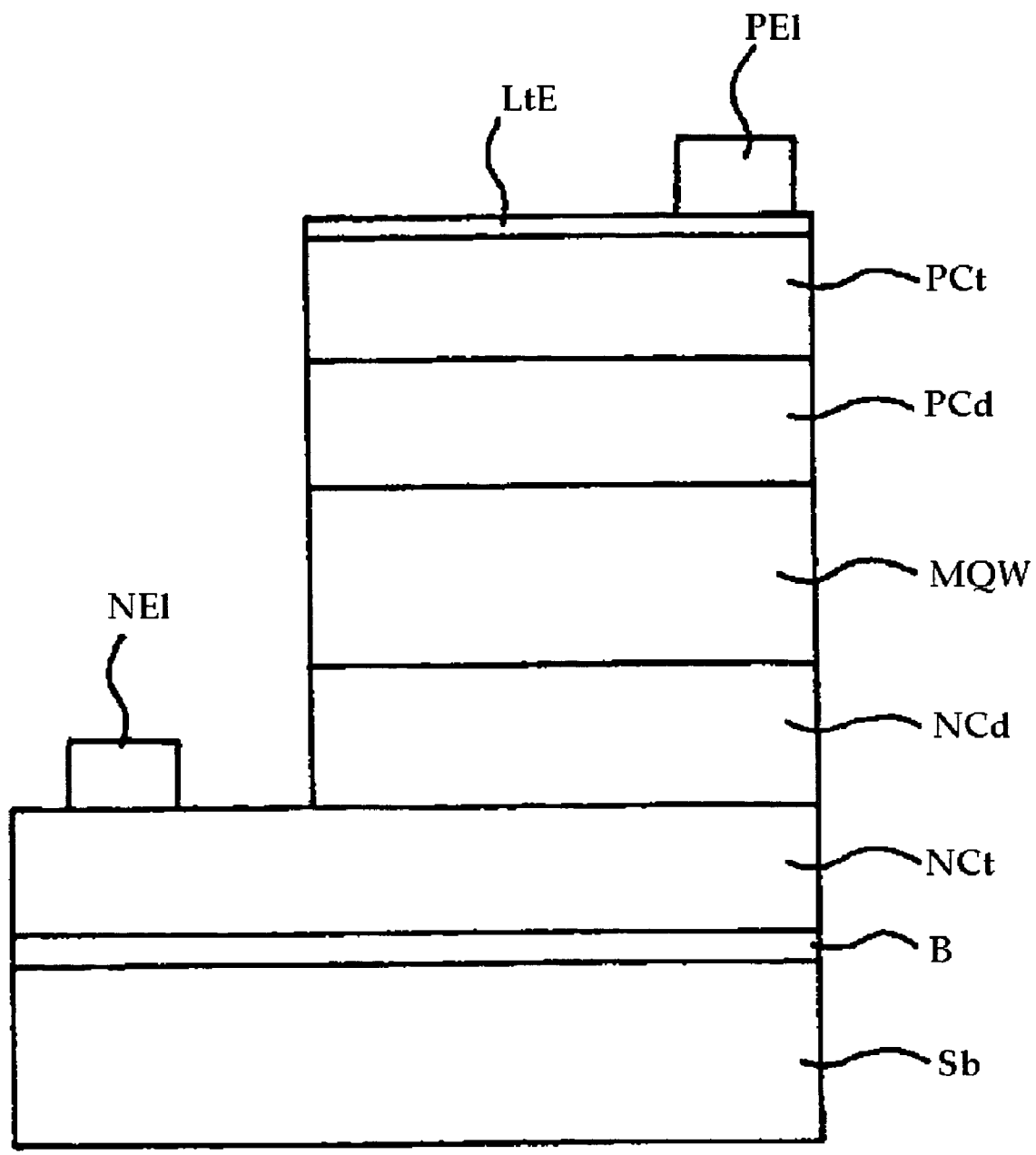
FIG. 3 illustrates an exemplary layer structure for a near UV emitting semiconductor light source.

FIG. 3 shows an exemplary layer structure of a semiconductor light source. The blue semiconductor light comprises a substrate Sb, for example, a sapphire substrate. For example, a buffer layer B, an n-type contact layer NCt, an n-type cladding layer NCd, a multi-quantum well active layer MQW, a p-type cladding layer PCd, and a p-type contact layer PCt are formed in that order as nitride semiconductor layers. The layers can be formed, for example, by organometallic chemical vapor deposition (MOCVD), on the substrate Sb. Thereafter, a light-transparent electrode LtE is formed on the whole surface of the p-type contact layer PCt, a p electrode PEl is formed on a part of the light-transparent electrode LtE, and an n electrode NEl is formed on a part of the n-type contact layer NCt. These layers can be formed, for example, by sputtering or vacuum deposition.

The buffer layer B can be formed of, for example, AlN, and the n-type contact layer NCt can be formed of, for example, GaN.

The n-type cladding layer NCd can be formed, for example, of $Al_rGa_{1-r}N$ wherein $0 \leq r < 1$, the p-type cladding layer PCd can be formed, for example, of $Al_qGa_{1-q}N$ wherein $0 < q < 1$, and the p-type contact layer PCt can be formed, for example, of $Al_sGa_{1-s}N$ wherein $0 \leq s < 1$ and $s < q$. The band gap of the p-type cladding layer PCd is made larger than the band gap of the n-type cladding layer NCd. The n-type cladding layer NCd and the p-type cladding layer PCd each can have a single-composition construction, or can have a construction such that the above-described nitride semiconductor layers having a thickness of not more than 100 angstroms and different from each other in composition are stacked on top of each other so as to provide a superlattice structure. When the layer thickness is not more than 100 angstroms, the occurrence of cracks or crystal defects in the layer can be prevented.

The multi-quantum well active layer MQW can be composed of a plurality of InGaN well layers and a plurality of GaN barrier layers. The well layer and the barrier layer can have a thickness of not more than 100 angstroms, preferably 60 to 70 angstroms, so as to constitute a superlattice structure. Since the crystal of InGaN is softer than other aluminum-containing nitride semiconductors, such as AlGaN, the use of InGaN in the layer constituting the active layer MQW can offer an advantage that all the stacked nitride semiconductor layers are less likely to crack. The multi-quantum well active layer MQW can also be composed of a plurality of InGaN well layers and a plurality of AlGaN barrier layers. Or, the multi-quantum well active layer MQW can be composed of a plurality of AlInGaN well layers and a plurality of AlInGaN barrier layers. In this case, the band gap energy of the barrier layer can be made larger than the band gap energy of the well layer.

A reflecting layer can be provided on the substrate Sb side from the multi-quantum well active layer MQW, for example, on the buffer layer B side of the n-type contact layer NCt. The reflecting layer can also be provided on the surface of the substrate Sb remote from the multi-quantum well active layer MQW stacked on the substrate Sb. The reflecting layer can have a maximum reflectance with respect to light emitted from the active layer MQW and can be formed of, for example, aluminum, or can have a multi-layer structure of thin GaN layers. The provision of the reflecting layer permits light emitted from the active layer MQW to be reflected from the reflecting layer, can reduce the internal absorption of light emitted from the active layer MQW, can increase the quantity of light output toward above, and can reduce the incidence of light on the mount for the light source to prevent a deterioration.

Figure 2:
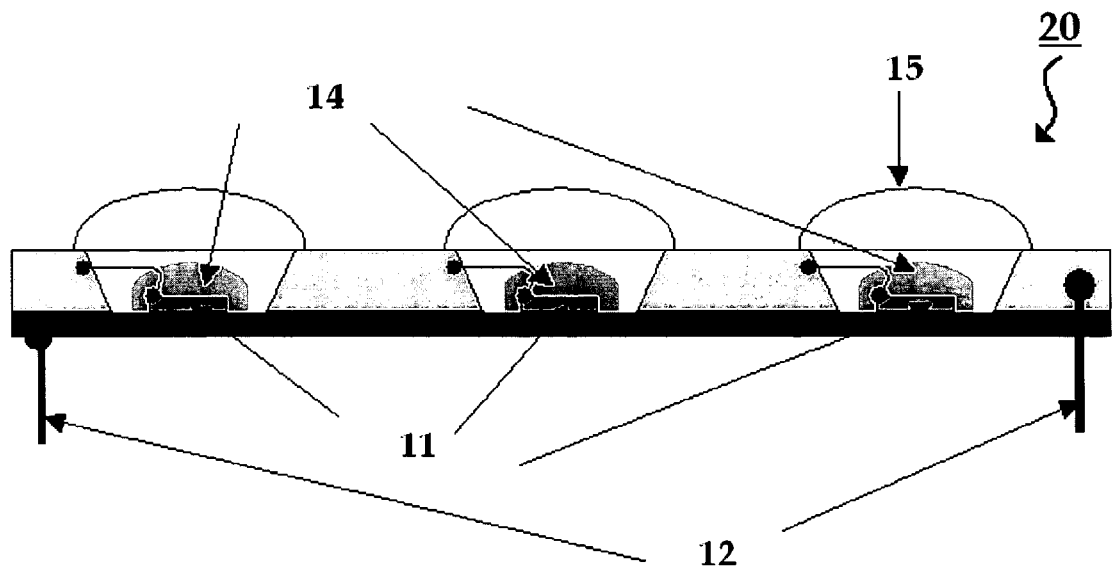

Shown in FIGS. 1-2 are some exemplary LED-phosphor device structures. FIG. 1 shows a light emitting device 10 with an LED chip 1 powered by leads 2, and having phosphor-containing material 4 secured between the LED chip and the light output 6. A reflector 3 can serve to concentrate light output. A transparent envelope 5 can isolate the LED and phosphor from the environment and/or provide a lens. The lighting device 20 of FIG. 2 has multiple LED chips 11, leads 12, phosphor-containing material 14, and transparent envelope 15.

It will be understood by those of ordinary skill in the art that there are any number of ways to associate phosphors with an semiconductor light source such that light from the semiconductor light source is managed by its interaction with the phosphors. U.S. patent applications 2004/0145289 and 2004/0145288 illustrate lighting devices where phosphor is positioned away from the light output of the semiconductor light sources. U.S. patent applications 2004/01450307 and 2004/0159846 further illustrate, without limitation, lighting devices that can be used in the invention.

Semiconductor light source-based white light devices can be used, for example, in a self-emission type display for displaying a predetermined pattern or graphic design on a display portion of an audio system, a household appliance, a measuring instrument, a medical appliance, and the like. Such semiconductor light source-based light devices can also be used, for example, as light sources of a back-light for LCD displays, a printer head, a facsimile, a copying apparatus, and the like.

Among the additional phosphors that can be mixed with phosphors of the invention, some of those believed to be useful include: $Y_3Al_5O_{12}:Ce^{3+}$ (YAG), $Lu_3Ga_2(AlO_4)_3:Ce^{3+}$; $La_3In_2(AlO_4)_3:Ce^{3+}$; $Ca_3Ga_5O_{12}:Ce^{3+}$; $Sr_3Al_5O_{12}:Tb^{3+}$; $BaYSiAlO_{12}:Ce^{3+}$; $CaGa_2S_4:Eu^{2+}$; $SrCaSiO_4:Eu^{2+}$; $ZnS:Cu$, $CaSi_2O_2N:Eu^{2+}$; $SrSi_2O_2N:Eu^{2+}$; $SrSiAl_2O_3N_2:Eu2+$; $Ba_2MgSi_2O_7:Eu^{2+}$; $Ba_2SiO_4:Eu^{2+}$; $La_2O_3.11Al_2O_3:Mn^{2+}$; $Ca_8Mg(SiO_4)_4Cl_2:Eu^{2+},Mn^{2+}$; $(CaM)(Si,Al)_{12}(O,N)_{16}:Eu^{2+},Tb^{3+},Yb^{3+}$; $YBO_3:Ce^{3+}$; $BaMgAl_{10}O_{17}:Eu^{2+},Mn^{2+}$; $(Sr,Ca,Ba)(Al,Ga)_2S_4:Eu^{2+}$; $BaCaSi_7N_{10}:Eu^{2+}$; $(SrBa)_3MgSi_2O_8:Eu^{2+}$ $(SrBa)_2P_2O_7:Eu^{2+}$; $(SrBa)_2Al_{14}O_{25}:Eu^{2+}$; $LaSi_3N_5:Ce^{3+}$; $(BaSr)MgAl_{10}O_{17}:Eu^{2+}$; and $CaMgSi_2O_7:Eu^{2+}$.

One or more of these additional phosphors may be located in the light emitting device appropriately to convert at least a portion of the light output to a light of a higher wavelength. In certain embodiments, the additional phosphors are selected to sufficiently convert the light output so that a total light output for the device has a specific chromaticity, e.g., a white chromaticity.

Temperatures described herein for processes involving a substantial gas phase are of the oven or other reaction vessel in question, not of the reactants per se.

"White" light is light of certain chromaticity values that are known and well published in the art.

The following examples further illustrate the present invention, but of course, should not be construed as in any way limiting its scope.

EXAMPLE 1

Phosphor Formation without Modifier

The steps for one exemplification of the phosphor-forming process were:

1. Preparation of $Eu_3+/Sr_2+$ solution: 1.408 gram of $Eu_2O_3$ was dissolved in 200 mL dilute nitric acid. 28.34 gram of $SrCO_3$ was slowly added into the solution. Nitric acid was added as necessary. 0.6 mL of 0.01 M $Pr_6O_{11}$ solution was added to this system. Deionized water was added to make 300 mL.
2. Preparation of sulfate solution: 60 gram of $(NH_4)_2SO_4$ was dissolved in 270 mL deionized water for a 300 mL solution.
3. Precipitation of $SrSO_4$ fine powders: The sulfate solution prepared in step 2 was added into the solution of step 1 while stirring for ten minutes, resulting in the formation of a $SrSO_4$ fine powder. The pH was adjusted to pH 2.2.
4. Preparation of Ga solution: 28.72 gram of gallium metal was dissolved in 200 mL concentrated nitric acid. The solution was warmed until the nitric acid fumed (and the preparation turns to brownish). The solution was cooled to room temperature and set overnight. After this overnight setting, the solution was clear greenish. The solution was heated until it turned yellow and then clear. Deionized water was added to make a 500 mL solution. The pH was adjusted to pH 2.02 with ammonium hydroxide (approximately 40 mL), and then deionized water was added to 600 mL.
5. Precipitation of $Ga(OH)_3$: The Ga solution prepared in step 4 was added to the suspension from step 3, and the pH adjusted to pH 7.0. The suspension was stirred for 17 hours at room temperature, then set for two hours. A product of white fine powder was filtered out.
6. The powder was rinsed with acetone, then stirred with 1400 mL acetone for 1 hour at 50° C. prior to another filtration to recover the powder. The powder was dried.
7. The powder was ball milled for 5 hours, filtered and dried overnight.
8. The powder was fired at 800° C. for 5 hours in $H_2S$ gas. After being cooled down to room temperature, the powder was ground (can be ball milled) for 40 minutes.
9. The phosphor was again fired at 900° C. for 2 hours in $H_2S$ gas.

The X-ray powder diffraction data of this sample showed the co-existence of two crystalline phases, one is $SrGa_2S_4$, and the other is $Ga_2S_3$. The grain size was measured on a Horiba CAPA-700 Grain Analyzer to be between 1 and 8.5 micron with a median size of 4.66 micron. The quantum efficiency was measured at 89% using the emission band at 537 nm with 450 nm excitation.

EXAMPLE 2

Phosphor Formation with Organic Modifier

The steps for one exemplification of the phosphor-forming process were:

1. Preparation of $Eu_3+/Sr_2+$ solution: 2.815 gram of $Eu_2O_3$ was dissolved in 400 mL dilute nitric acid. 56.69 gram of $SrCO_3$ was slowly added into the solution. Additional nitric acid was added as necessary. 1.2 mL of 0.01 M $Pr_6O_{11}$ solution was added to this system. Deionized water was added to make a 600 mL solution. Then 600 mL ethyl alcohol was added to make 1200 mL.
2. Preparation of sulfuric acid solution: 50 mL 97% concentrated sulfuric acid was diluted in 300 mL deionized water.
3. Precipitation of $SrSO_4$ fine powders: The sulfuric acid solution prepared in step 2 was added into the Eu3+/Sr2+ solution made in step 1 while stirring for ten minutes, resulting in a $SrSO_4$ fine powder. The pH was adjusted to pH 1.3.
4. Preparation of Ga solution: 57.17 grams of metal gallium was dissolved in 400 mL concentrated nitric acid. The solution was warmed until the nitric acid fumed (turned brownish). After the solution was cooled to room temperature and set overnight, the solution was transparent greenish. The solution was heated until it turned yellow and then clear. Deionized water was added to make a 1000 mL solution. The pH was adjusted to pH 1.2 with ammonium hydroxide (approximately 80 mL), then deionized water was added to 1200 mL.
5. The Ga solution made in step 4 was added to the suspension obtained in step 3 while vigorously stirring. Ethyl alcohol was added to the suspension to a total volume of 3.4 L. The pH was adjusted to pH 7.0. The suspension was stirred for two hours and then allowed to settle overnight. The supernatant was decanted and the powder filtered out. The powder was rinsed with acetone several times. The powder was dried at 55° C. overnight.
6. The powder was ball milled in acetone with alumina balls for 5 hours, then filtered and dried overnight.
7. The powder was fired precursor at 800° C. for 5 hour in $H_2S$. The fired phosphor product was ground.
8. The phosphor was again fired at 900° C. for 1 hour in $H_2S$.

The X-ray powder diffraction data of this phosphor sample showed the co-existence of two crystalline phases, one was $SrGa_2S_4$, and the other $Ga_2S_3$. The grain size was measured on a Horiba CAPA-700 Grain Analyzer to be between 1 and 7 micron with median size of 3.40 micron. The quantum efficiency was 90% using the emission band at 537 nm with 450 nm excitation.

EXAMPLE 3

With Surfactant Modifier

The steps for one exemplification of the phosphor-forming process were:

1. Preparation of $Eu_3+/Sr_2+$ solution: 2.815 gram of $Eu_2O_3$ was dissolved in 400 mL dilute nitric acid. 56.69 gram of $SrCO_3$ was slowly added into the solution. Additional nitric acid was added as necessary. 1.2 mL of 0.01 M $Pr_6O_{11}$ solution was added to this system. Deionized water was added to make 600 mL. 2 wt % sorbitan monolaurate of the $SrCO_3$ weight (1.4 mL) was added. Then, 600 ethyl alcohol was added to make a 1200 mL.
2. Preparation of sulfate solution: 120 gram of $(NH_4)_2SO_4$ was dissolved in 540 mL deionized water for a 600 mL solution.
3. Precipitation of $SrSO_4$ fine powders: The sulfate solution prepared in step 2 was added into the solution of step 1 while stirring for ten minutes, which resulted in the formation of $SrSO_4$ fine powder. The pH was adjusted to pH 1.75.
4. Preparation of Ga solution: 57.54 gram of gallium metal was dissolved in 400 mL concentrated nitric acid. The solution was warmed until the nitric acid fumed (turned to brownish). The solution was cooled to room temperature and set overnight. After this setting, the solution was clear greenish. The solution was heated until it turned yellow and then clear. Deionized water was added to make a 1000 mL. The pH was adjusted to pH 2.02 with ammonium hydroxide (approximately 80 mL). Then deionized water was added to 1200 mL.
5. Precipitation of $Ga(OH)_3$: The Ga solution prepared in step 4 was added into the suspension from step 3, and the pH adjusted to pH 7.0. The suspension was stirred for 2 hours at room temperature, then set for 15 hours. A white colored fine powder was recovered by filtration.
6. The powder was rinsed with acetone, filtered, mixed with 1400 mL acetone for 1 hour at 50° C., and filtered again. The powder was dried.
7. The powder was ball milled for 12 hours.
8. The powder was fired at 800° C. for 5 hours in $H_2S$ gas. After being cooled to room temperature, the powder was ground (or can be ball milled) for 40 minutes.
9. The phosphor was again fired at 900° C. for 2 hours in $H_2S$ gas.

The X-ray powder diffraction data of this phosphor sample showed the co-existence of two crystalline phases, one is $SrGa_2S_4$, and the other is $Ga_2S_3$. The grain size was measured on a Horiba CAPA-700 Grain Analyzer to be between 1 and 12 micron with median size of 6.8 micron. The quantum efficiency was measured as 88% using the emission band at 537 nm with 450 nm excitation.

EXAMPLE 4

Sizing

The steps for one exemplification of the sizing process were:

1. Preparation of ethyl alcohol suspension of STG phosphor: 135 grams of STG phosphor powder was suspended in 450 mL ethyl alcohol. The powder had grain size ranging from 1 to 14 micron with a median of 7.6 micron.
2. The suspension was sonicated for 12 minutes.
3. The suspension was allowed to settle for 30 minutes. A portion of the powder settled while another portion of the powder remained suspended.
4. The suspension was transferred to another container, while the settled portion was isolated as a larger-sized portion.
5. Repeat steps 3-4 to obtain a intermediate sized portion (second settled portion) and a smallest portion (second supernate).

The grain sizes of the three samples were measured on a Horiba CAPA-700 Grain Analyzer. The large sized part: median size 7.74 micron, 84 grams, quantum efficiency 91%; the intermediate size portion: 4.58 micron, quantum efficiency 87%; and the small size portion: 2.67 micron, quantum efficiency 92%.

EXAMPLE 5

Ball-Milling Post Firing

A weighed amount of STG phosphor with median particle size of 10.5 micron is suspended in acetone. The suspension is then placed into an alumina milling jar containing ¼ inch (0.635 cm) glass balls. Milling then proceeded for 40 minutes. After milling, the powder was dried at 55° C. The particles size was measured to be 7.2 micron (median). The quantum efficiency of the milled sample was 39%, while the quantum efficiency of the unmilled sample was 91%. Annealing of the milled phosphor at 500° C. for 2 hours recovered partly the emission efficiency to 45%.

EXAMPLE 6

Part A. Preparation of Calcium Sulfate
Calcium carbonate (300 grams) was stirred with water and nitric acid was added to dissolve the carbonate salt. A slight excess of calcium carbonate was added to provide a solution having a pH of 5 or higher. The resultant calcium nitrate solution was milky in appearance.

1.5 Grams of magnesium metal pieces were cleaned with dilute nitric acid, rinsed, and added to the calcium nitride solution to remove metallic impurities. This mixture was heated to about 85° C. while stirring, and allowed to cool. Stirring can be continued overnight. The solution was filtered until clear.

180 mL of sulfuric acid was slowly added to the nitrate solution and stirred during precipitation of the calcium sulfate salt. The mixture was stirred for two hours, which can be longer, at a temperature of about 60° C.

The liquid was decanted and the solids rinsed with water until the solids were free of acid. A final rinse with methanol assists in drying the solid, which was carried out in an oven at 100° C. overnight.

Part B. Preparation of a Strontium-Calcium Sulfide Phosphor
Equimolar amounts (4.76 mol) of the calcium sulfate as prepared in Part A and strontium sulfate were combined with europium oxide dissolved in dilute nitric acid and slurried. The resultant solids were ground, oven dried overnight, and ground with a mortar and pestle.

The combined salts were fired first in $N_2/H_2$ (forming gas) in a quartz boat, increasing the temperature at a rate of 15°/min up to about 600° C., held for about 3 hours. The temperature was increased to 900° C. at the same rate and held for about 3 hours. The solids were then ground with a mortar and pestle.

The temperature was increased at a rate of about 20.degree./min in a hydrogen sulfide atmosphere to 1000° C. and held for 6 hours. The solids were then ground with a mortar and pestle.

A halide dopant such as ammonium chloride was added and fired in a quartz tube, placed in a reverse quartz tube and the temperature increased to 1100° C. at a rate of 20°/min in nitrogen for about one hour. The solids were ground with a mortar and pestle, sieved through a 100 mesh screen and stored under dry conditions.

The resultant phosphor was orange in color, had a powder density of about 4.3-4.8 g/ml, a tunable CIE chromaticity coordinate of x=0.600.+−.0.025 and y−−0.350.−−.0.025; a tunable external quantum efficiency of >80%; a tunable emission peak of about 635-645 (broad band); a band width at half height of 68 nm; and an excitation peak of 475 nm.

FIG. 1 of US 2003/0132433 is a graph of emission intensity versus wavelength for the phosphor. The excitation spectrum labeled "A" is shown on the left. The emission color changes from yellow to deep red as the strontium:calcium ratio changes from a ratio of about 10 to 0.1. The excitation spectra changes its maximum position to longer wavelength as the calcium content increases.

The emission spectra shown at the right of FIG. 1 (of US 2003/0132433) shifts from a peak at 618 nm to 655 nm as the calcium content increases. The peak labeled "1" is a phosphor having a Sr:Ca ratio of 0.8:0.2.

The peak labeled "2" is a phosphor having a Sr:Ca ratio of 0.75:0.25.

The peak labeled "3" is a phosphor having a Sr:Ca ratio of 0.50:0.50.

The peak labeled "4" is a phosphor having a Sr:Ca ratio of 0.25:0.75.

The peak labeled "5" is a phosphor having a Sr:Ca ratio of 0.20:0.80.

EXAMPLE 7

The procedure of Example 6 was followed to make a phosphor having the formula $Sr_{0.75}Ca_{0.25}:Eu_{0.075}Cl$.

The chloride content was varied and the effects are shown in FIG. 2 (of US 2003/0132433). FIG. 2 (of US 2003/0132433) is a graph of emission intensity versus wavelength for this phosphor. The spectra curve labeled "1" is for a phosphor having a chloride content of 1.5%. The spectra curve labeled "2" is for a phosphor having a chloride content of 0.5%. The spectra curve labeled "3" is for a phosphor having no chloride. It can be seen that the emission intensity decreases as the chloride content decreases.

Publications and references, including but not limited to patents and patent applications, cited in this specification are herein incorporated by reference in their entirety in the entire portion cited as if each individual publication or reference were specifically and individually indicated to be incorporated by reference herein as being fully set forth. Any patent application to which this application claims priority is also incorporated by reference herein in the manner described above for publications and references.

While this invention has been described with an emphasis upon preferred embodiments, it will be obvious to those of ordinary skill in the art that variations in the preferred devices and methods may be used and that it is intended that the invention may be practiced otherwise than as specifically described herein. Accordingly, this invention includes all modifications encompassed within the spirit and scope of the invention as defined by the claims that follow.

What is claimed:

1. A mixture of two or more phosphors, one of a first emission energy and the second of a lower emission energy, comprising:

the first phosphor of the formula (I)

$$Sr_{1-x3}Ca_{x3}Ga_2S_4:Eu:xGa_2S_3 \qquad (I)$$

wherein x is 0 to about 0.2, wherein x3 is 0.0001 to 1, and wherein a minor part of the europium component is substituted with praseodymium in an efficiency enhancing amount;

and the second phosphor of the formula (II):

$$Sr_{x2}Ca_{1-x2}S:Eu^{2+}, Y \qquad (II)$$

wherein x2 is a number from 0 to 1.0, and Y is one or more halides in atomic or ionic form.

2. The phosphor mixture of claim 1, wherein the median grain size of the phosphor of formula I is from 2 to 4.5 microns.

3. The phosphor mixture of claim 1, wherein the first phosphor emits with an emission peak having wavelength from 492 nm to 560 nm.

4. The phosphor mixture of claim 3, wherein the second phosphor emits with an emission peak having wavelength from 605 nm to 670 nm.

5. The phosphor mixture of claim 1, wherein the second phosphor emits with an emission peak having wavelength from 605 nm to 670 nm.

6. A light emitting device comprising: a light source producing a light output; and the phosphor mixture of claim 1, located to convert at least a portion of the light output to a higher wavelength.

7. The light emitting device of claim 6, further comprising one or more additional phosphors located to convert at least a portion of the light output to a higher wavelength.

8. The light emitting device of claim 6, wherein the phosphors are selected to sufficiently convert the light output so that a total light output for the device has a white chromaticity.

9. The light emitting device of claim 6, wherein the second phosphor is effective to convert the light output to increase light having wavelength from 605 nm to 660 nm.

10. The light emitting device of claim 6, wherein the first phosphor is effective to convert the light output to increase light having wavelength from 492 nm to 560 nm.

11. The light emitting device of claim 6, further comprising a third phosphor effective to convert the light output to increase light having wavelength from 530 nm to 610 nm.

12. The light emitting device of claim 6, wherein the light source is an LED providing light in the range from 215 nm to 515 nm.

* * * * *